(12) United States Patent
Pandey et al.

(10) Patent No.: US 7,568,134 B1
(45) Date of Patent: Jul. 28, 2009

(54) METHOD OF EXHAUSTIVELY TESTING AN EMBEDDED ROM USING GENERATED ATPG TEST PATTERNS

(75) Inventors: Amit Raj Pandey, Austin, TX (US);
Peggy A. Nissen, Cupertino, CA (US);
Shridhar G. Bendi, Karnataka (IN)

(73) Assignee: Advanced Micro Devices, Inc., Sunnyvale, CA (US)

( * ) Notice: Subject to any disclaimer, the term of this patent is extended or adjusted under 35 U.S.C. 154(b) by 389 days.

(21) Appl. No.: 10/770,170

(22) Filed: Feb. 2, 2004

(51) Int. Cl.
*G11C 29/00* (2006.01)
*G01R 31/28* (2006.01)
*G06F 17/10* (2006.01)

(52) U.S. Cl. .......................... 714/718; 714/738; 703/2
(58) Field of Classification Search ................. 714/718, 714/719, 736, 763, 738, 733, 734, 724, 735, 714/819; 703/2; 365/200, 201, 63; 716/4
See application file for complete search history.

(56) References Cited

U.S. PATENT DOCUMENTS

| | | | | |
|---|---|---|---|---|
| 5,313,624 A * | 5/1994 | Harriman et al. | ................. | 714/6 |
| 5,553,082 A * | 9/1996 | Connor et al. | ............... | 714/733 |
| 5,682,389 A * | 10/1997 | Nizaka | ........................ | 714/718 |
| 5,696,770 A * | 12/1997 | Lo | ............................. | 714/718 |
| 5,732,209 A * | 3/1998 | Vigil et al. | .................... | 714/30 |
| 5,745,403 A * | 4/1998 | Taylor | ......................... | 365/145 |
| 6,073,263 A * | 6/2000 | Arkin et al. | .................. | 714/738 |
| 6,085,283 A * | 7/2000 | Toda | ............................ | 711/104 |
| 6,182,257 B1 * | 1/2001 | Gillingham | .................. | 714/733 |
| 6,201,756 B1 * | 3/2001 | Lee | ......................... | 365/230.04 |
| 6,421,797 B1 * | 7/2002 | Kim | ............................. | 714/718 |
| 6,496,947 B1 * | 12/2002 | Schwarz | ....................... | 714/30 |
| 6,601,211 B1 * | 7/2003 | Norman | ....................... | 714/773 |
| 6,618,314 B1 * | 9/2003 | Fiscus et al. | ................. | 365/227 |
| 6,633,999 B1 * | 10/2003 | Lee | ............................... | 714/30 |
| 6,715,028 B1 * | 3/2004 | Toda | ............................ | 711/104 |
| 6,813,201 B2 * | 11/2004 | Zarrineh et al. | ............. | 365/201 |
| 6,873,552 B2 * | 3/2005 | Ishii et al. | ............... | 365/185.24 |
| 6,961,881 B2 * | 11/2005 | Yamazaki et al. | ............ | 714/718 |
| 7,043,650 B2 * | 5/2006 | Bresniker et al. | ........... | 713/324 |
| 7,134,058 B2 * | 11/2006 | Lauga | .......................... | 714/718 |
| 2003/0076723 A1 * | 4/2003 | Zarrineh et al. | ............. | 365/201 |
| 2005/0086132 A1 * | 4/2005 | Kanitz et al. | .................. | 705/28 |
| 2006/0150046 A1 * | 7/2006 | Ong | ............................. | 714/738 |

\* cited by examiner

*Primary Examiner*—Phung M Chung
(74) *Attorney, Agent, or Firm*—Hamilton & Terrile, LLP

(57) ABSTRACT

A model of the memory device is provided, including a memory array model having a plurality of memory array model locations, and a plurality of decoder models, each associated with a memory array model location. Each memory array model location includes a first data set accessed with the input to that memory array model location in a first state, and a second data set accessed with the input to that memory array model location in a second state. The memory device model is provided to an automatic test pattern generation (ATPG) tool, and a test pattern is generated based on the memory device model.

12 Claims, 4 Drawing Sheets

METHOD OF EXHAUSTIVELY TESTING AN EMBEDDED ROM USING GENERATED ATPG TEST PATTERNS

BACKGROUND OF THE INVENTION

1. Technical Field

This invention relates generally to testing of semiconductor devices, and more particularly, to a method of testing read-only memory (ROM) using automatic test pattern generation (ATPG) patterns.

2. Background Art

FIG. 1 illustrates a read-only memory (ROM) 22 including a decoder 24 and an array 25 in the form of an embedded block in an overall semiconductor integrated circuit device 26. As an example, six address lines (generally indicated at 28) are included in order to provide a plurality of addresses to the decoder 24. The number of addresses is given by $2^6=64$ different addresses, corresponding to 64 locations $30_1$-$30_{64}$ in the ROM 22. The ROM locations $30_1$, $30_2$, $30_3$, . . . $30_{64}$ include respective data set $30A_1$-$30A_{64}$, each four bits wide, with the number of variations being given by $2^4=16$ possible different data sets (it will be understood that some locations in the ROM 22 include identical data sets). The ROM 22 includes four data output lines (generally indicated at 34), for providing from the ROM 22 the four-bit-wide data set from an addressed ROM location. The ROM 22 has connected thereto surrounding logic, generally indicated at 36, 37 for operative association with the ROM 22, and other parts (not shown) of the integrated circuit device 26.

In testing the structure of FIG. 1, and with reference to FIG. 2, it is well known to provide an ATPG-compliant model of the structure of FIG. 1 (Step 1), based on elements including the ROM 22 and surrounding logic 36, 37. An automatic test pattern generation tool (for example the Mentor Graphics, Inc. FastScan) is then applied to this model (Step 2) to generate an ATPG test pattern (Step 3) which is then applied to the hardware of FIG. 1 (Step 4). The ATPG tool generates the test pattern primarily based on the surrounding logic 36, 37 of the model and, depending on the form of the decoder 24, may or may not generate all 64 possible addresses to the ROM 22. In the situation where all 64 addresses are not generated, clearly not all locations in the ROM 22 are addressed, and tests for the locations will not be generated by the ATPG tool. Even if the form of the decoder 24 is such that the ATPG tool will generate all 64 addresses, the ATPG tool will generate a test for a location only if an output from that location is provided both in the case where a high logic level (logic level 1) is provided to that location, and in the case where a low logic level (logic level 0) is provided to that location. However, a conventionally designed ROM will generate an output from a location only with the input to that location logic level 1, and an output from that location will not be provided if the input to that location is logic level 0. In such case, the ATPG tool will not generate a test for that location. Hence, full coverage in testing the ROM 22 is not provided.

Therefore, what is needed is a method for providing that an ATPG tool, in generating a test pattern, is forced to generate a test for each location in a ROM, so that when such test pattern is applied to hardware including the ROM, the test pattern provides exhaustive testing of the ROM.

DISCLOSURE OF THE INVENTION

Provided herein is a method of generating a test pattern for a memory device. A model of the memory device is provided, comprising a memory array model including a plurality of memory array model locations. The model of the memory device further comprises a plurality of decoder models, each associated with a memory array model location. Each memory array model location includes a first data set accessed with the input to that memory array model location in a first state, and a second data set accessed with the input to that memory array model location in a second state. The memory device model is provided to an automatic test pattern generation (ATPG) tool, and a test pattern is generated based on the memory device model.

The present invention is better understood upon consideration of the detailed description below, in conjunction with the accompanying drawings. As will become readily apparent to those skilled in the art from the following description, there is shown and described (an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 3:
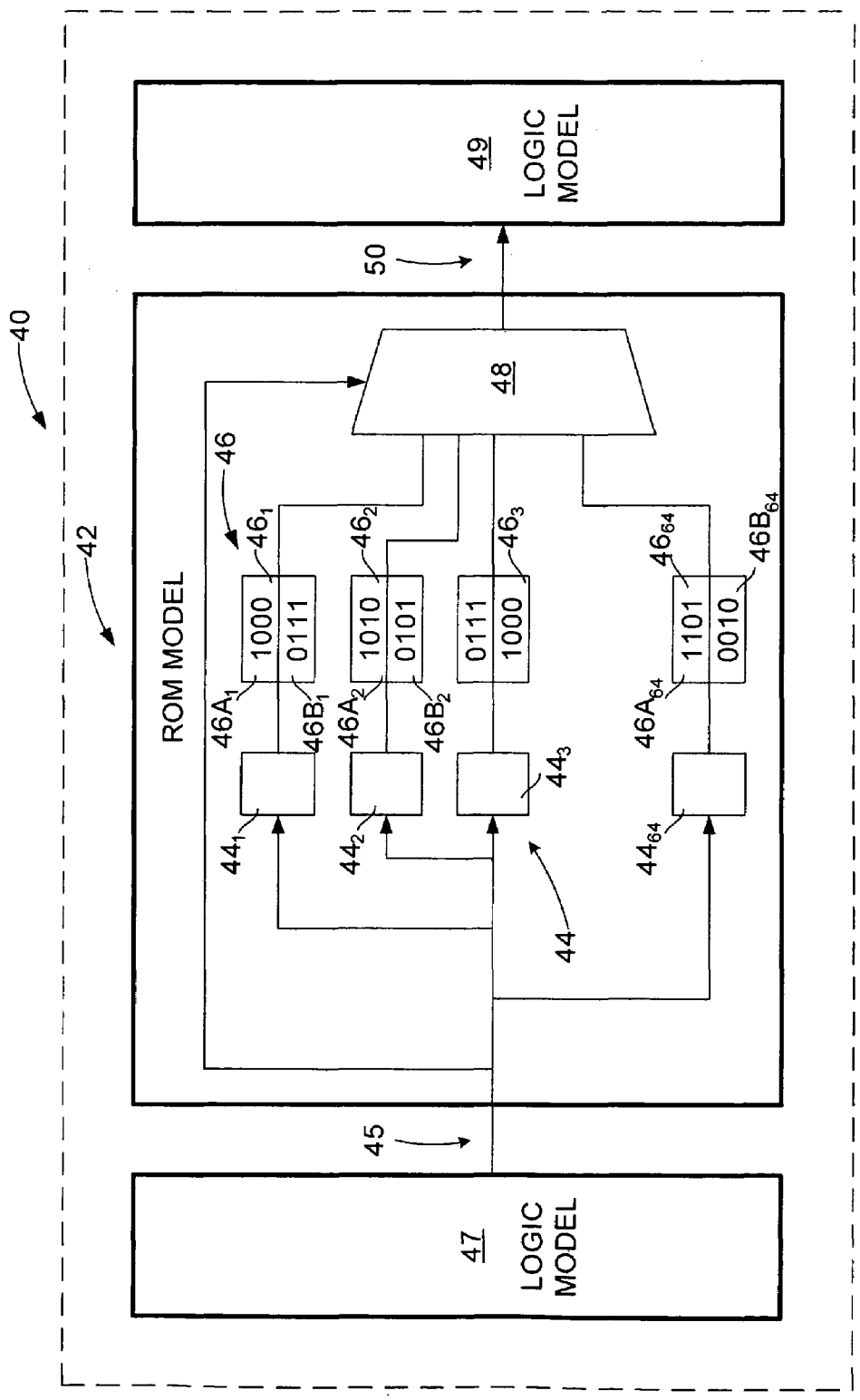
FIG. 3 illustrates a model generated in furtherance of practice of the present invention.

An ATPG-compliant model 40 in accordance with the present invention is shown in FIG. 3. As shown therein, the model 40 includes a read only memory (ROM) model 42 including a decoder model 44 including 64 individual decoder models $44_1$, $44_2$, $44_3$ . . . $44_{64}$, and an array model 46. The ROM model 42 has connected thereto surrounding logic models generally indicated at 47, 49 for operative association with the ROM model 42. The model 40 includes six address lines (generally indicated at 45) in order to provide a plurality of addresses. Again, it will be seen that with each address six bits wide, the number of addresses is given by $2^6=64$ different addresses. Each of the decoder models $44_1$-$44_{64}$ is directly connected to the plurality of six address lines 45, so that all decoder models $44_1$-$44_{64}$ simultaneously receive the particular six bit wide address from the address line 45. The memory array model 46 of the ROM model 42 includes 64 locations $46_1$, $46_2$, $46_3$ . . . $46_{64}$, with each of the decoder models for $44_1$-$44_{64}$ operatively connected only with a respective single location $46_1$-$46_{64}$. Each of the locations $46_1$-$46_{64}$ is connected to a multiplexer model (MUX) 48 which is part of the ROM model 42, and which is also directly connected to the plurality of six address lines 45, so that the MUX 48 receives the particular six bit wide address being provided from the six address lines 45 to the individual decoder models $44_1$-$44_{64}$.

The decoder models $44_1$-$44_{64}$ are configured so that even though all such decoder models simultaneously receive a particular statewide address from the address line 45, only one decoder model responds to that particular address to access a location operatively connected thereto. That is to say, for example, with the address 001010 provided to each of the decoder models $44_1$-$44_{64}$, only decoder model $44_2$ responds to that address to access location $46_2$. On the other hand, and further by way of example, with the address 100010 provided to each of the decoder models for $44_1$-$44_{64}$, only decoder model $44_3$ responds to that address to access location $46_3$.

The locations $46_1$-$46_{64}$ include respective first four-bit-wide data sets $46A_1$-$46B_4$, and respective second four-bit-wide data sets $46B_1$-$46B_{64}$. The first data set of each location corresponds to the data set for that location in the ROM 22 on which the model is based. The second data set has a value wherein each bit is the reverse or compliment of the corresponding bit of the first data set of that location. For example as shown in location $46_2$, the first data set $46A_2$ is 1010 (as in ROM 22), while the second data set $46B_2$ is 0101.

With a particular address provided to all decoder models for $44_1$-$44_{64}$, only a single decoder model provides a high output (logic level 1) to a location to access a location. In such case, that location's first four-bit-wide data set is accessed and is provided to the MUX model 48, as is the six-bit address provided to the decoder model which accesses that location. In response, the first data set is provided as an output from four output data lines generally indicated at 50 of the MUX model 48.

As an example, as indicated above, with the address 001010 provided to each of the decoder models for $44_1$-$44_{64}$, only decoder model $44_2$ responds to that address to provide a logic level 1 to location $46_2$ (all other outputs of the decoder models being at logic level 0, so that no other locations are accessed). Consequently, the four-bit-wide data set 1010 is provided to the MUX model 48, as is the address 001010, and a four-bit-wide data set output 1010 is provided from the MUX model 48.

As noted, only a single decoder model responds to an address to provide a logic level 1 to a location. However, if through a fault that single decoder model fails to provide the expected logic level 1, instead providing the alternative logic level 0, the second four-bit-wide data set of that location is accessed, rather than the first four-bit-wide data set, and this second four-bit-wide data set is provided to the MUX model 48. Consequently, the second four-bit-wide data set output is provided from the MUX model 48, instead of the first four-bit-wide data set. For example, with the address 001010 provided to each of the decoder models for $44_1$-$44_{64}$, and with only decoder model $44_2$ responding to that address, rather than the expected logic level 1 being provided from that decoder model $44_2$ to the location $46_2$, a logical level 0 is provided, and the four-bit-wide data set 0101 of the location $46_2$ is accessed and provided to the MUX model 48. The model is constructed to include information so as to be able to compare expected output data from the MUX model 48 (based on an expected logic level 1 from a particular decoder model, in turn based on a particular address) with actual output data from the MUX model 48. If the actual output data from the MUX model 48 is as expected for all addresses, it is understood that the model construction is appropriate. On the other hand, if the actual output data is the opposite (bit-by-bit) of the expected output data, it is understood that the expected logic level 1 from a particular decoder model was not achieved, based on a fault (for example a stuck on 0 fault) in the model. The model can then be reworked to correct this fault (and any other faults of this type) so that an appropriate model is provided.

Figure 1:
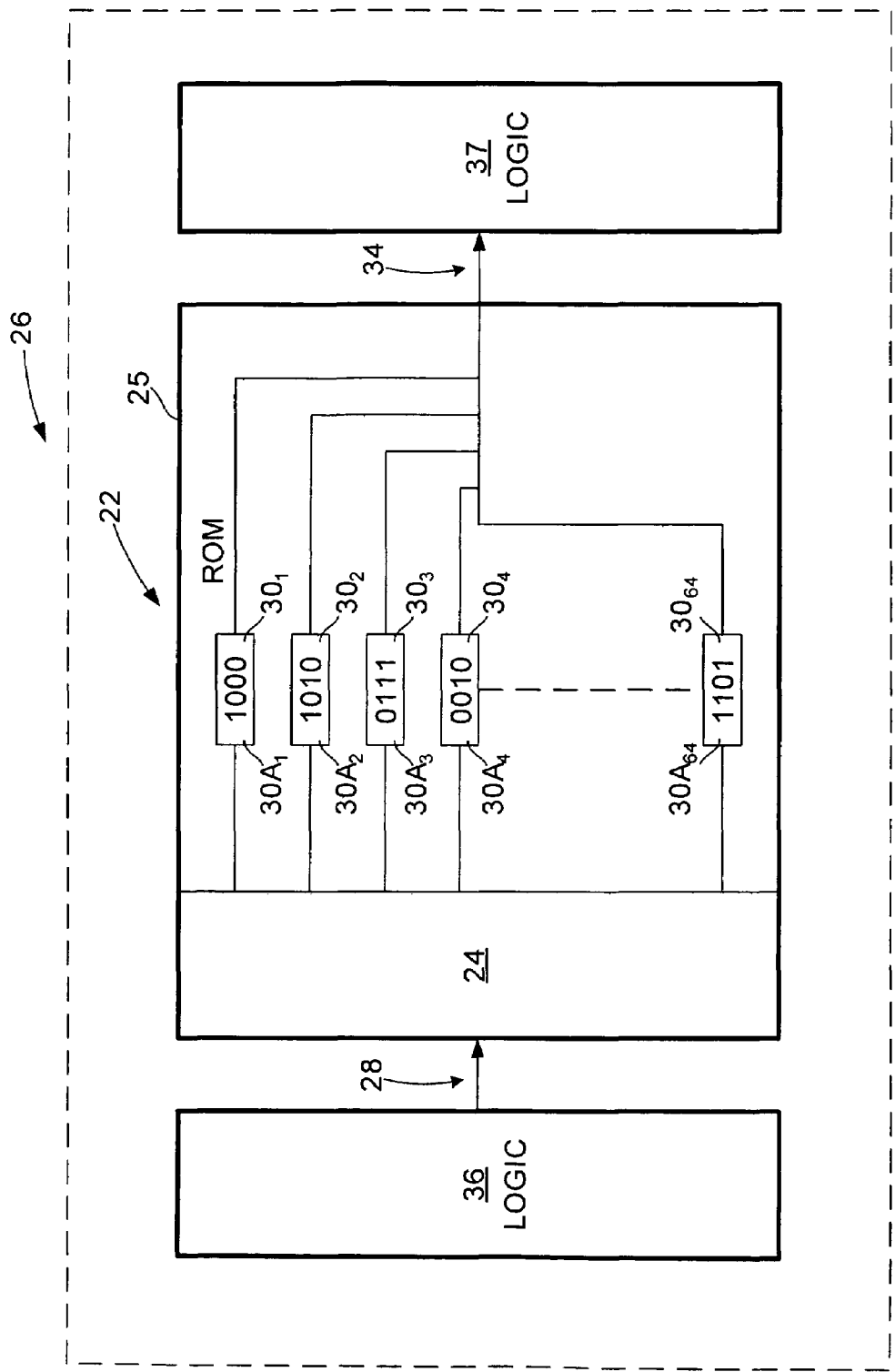
FIG. 1 illustrates a semiconductor integrated circuit device of the prior art.
Figure 2:
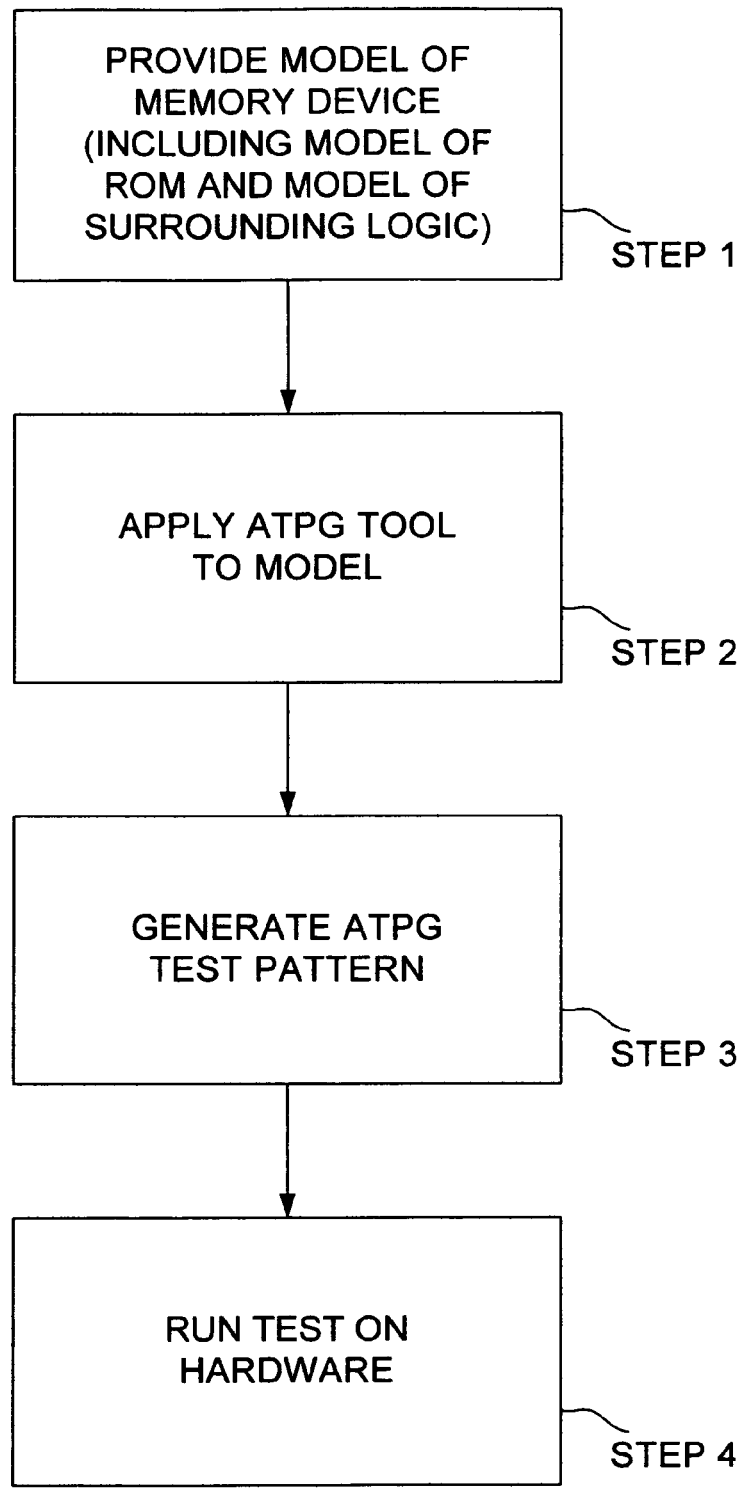
FIG. 2 is a flow diagram illustrating typical steps in generating a test pattern for the device of FIG. 1.
Figure 4:
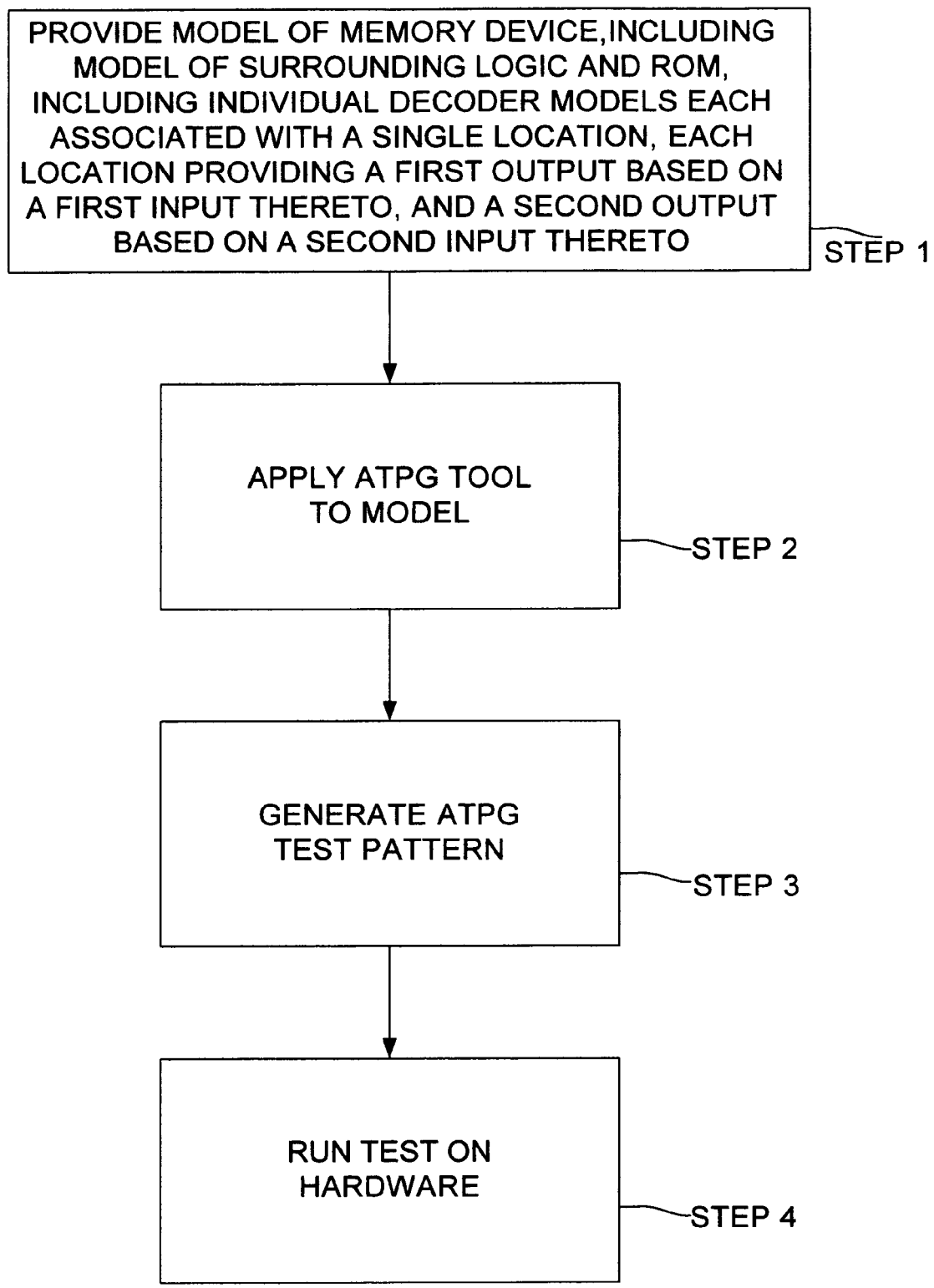
FIG. 4 is a flow diagram illustrating steps in the present invention.

With the ATPG-compliant model 40 of FIG. 3 as provided, and also with reference to FIG. 4 (Step 1), an automatic test pattern generation tool (in this example the Mentor Graphics, Inc. FastScan) is applied to this model (Step 2) to generate an ATPG test pattern (Step 3). In this situation, the ATPG tool recognizes the logic gates of the individual decoders $44_1$-$44_{64}$, and generates an ATPG test pattern based on recognizing each of these decoders $44_1$-$44_{64}$ as individual nodes. In this way, the ATPG tool is forced to generate all 64 possible addresses in the test pattern. In addition, an output is provided from each location in the case where a high logic level (logic level 1) is applied to that location, and in the case where a low logic level (logic level 0) is applied to that location as described above. Consequently, the requirements for forcing the ATPG tool to generate a test for each location are provided in the model 40. Then, when the test pattern generated by the ATPG tool is applied to the hardware of FIG. 1, full coverage in testing the ROM 22 is insured.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of providing a memory model comprising:
    providing a model of a ROM comprising a ROM array model including at least one ROM array model location; and
    providing that the ROM array model location includes a first data set accessed with an input to the ROM array location in a first state, and a second data set accessed with an input to the ROM array model location in a second state.

2. The method of claim 1 wherein the model of the memory further comprises a decoder model operatively associated with the ROM array model for providing input to the ROM array location.

3. A method of testing a ROM comprising:
    providing a model of the ROM comprising a ROM array model including at least one ROM array model location;
    providing that the ROM array model location includes a first data set accessed with an input to the ROM array model location in a first state, and a second data set accessed with an input to the ROM array model location in a second state;
    providing the ROM model to an automatic test pattern generation (ATPG) tool;
    generating a test pattern based on the ROM model; and
    applying the test pattern to the ROM.

4. The method of claim 3 wherein the model of the ROM further comprises a decoder model operatively associated with the ROM array model for providing input to the ROM array model location.

5. A method of testing a ROM comprising:

providing a model of the ROM comprising a ROM array model including a plurality of ROM array model locations;

providing that each ROM array model location includes a first data set accessed with an input to that ROM array model location in a first state, and a second data set accessed with an input to that ROM array model location in a second state;

providing the ROM model to an automatic test pattern generation (ATPG) tool;

generating a test pattern based on the ROM model; and applying the test pattern to the ROM.

6. The method of claim 5 wherein the model of the ROM further comprises a plurality of decoder models, each associated with a ROM array model location.

7. The method of claim 6 wherein an address provided to the ROM model is applied to each of the individual decoder models.

8. The method of claim 7 wherein, with an address provided to each of the individual decoder models, only a single decoder model output for accessing a location in the ROM array model is provided.

9. A memory model comprising:

a ROM array model including at least one ROM array model location;

the ROM array model location including a first data set accessed with an input to the ROM array model location in a first state, and a second data set accessed with an input to the ROM array model location in a second state.

10. The memory model of claim 9 and further comprising a decoder model operatively associated with the ROM array model for providing input to the ROM array model location.

11. A memory model comprising;

a ROM array model including a plurality of array model locations;

each ROM array model location including a first data set accessed with an input to the ROM array model location in a first state, and a second data set accessed with an input to that ROM array model location in a second state.

12. The memory model of claim 11 and further comprising a plurality of decoder models, each associated with a ROM array model location.

* * * * *